(12) United States Patent
Byun et al.

(10) Patent No.: US 10,249,438 B1
(45) Date of Patent: Apr. 2, 2019

(54) MULTILAYER CERAMIC CAPACITOR AND BOARD HAVING THE SAME

(71) Applicant: SAMSUNG ELECTRO-MECHANICS CO., LTD., Suwon-Si, Gyeonggi-Do (KR)

(72) Inventors: Man Su Byun, Suwon-Si (KR); Young Ghyu Ahn, Suwon-Si (KR); Ho Yoon Kim, Suwon-Si (KR); Jae Yeol Choi, Suwon-Si (KR); Soo Hwan Son, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/935,680

(22) Filed: Mar. 26, 2018

(30) Foreign Application Priority Data

Dec. 15, 2017 (KR) .......................... 10-2017-0173579

(51) Int. Cl.
| | |
|---|---|
| *H01G 4/30* | (2006.01) |
| *H05K 1/11* | (2006.01) |
| *H05K 1/18* | (2006.01) |
| *H01G 4/248* | (2006.01) |
| *H01G 4/12* | (2006.01) |
| *H01G 4/224* | (2006.01) |
| *H01G 4/012* | (2006.01) |

(52) U.S. Cl.
CPC .............. *H01G 4/30* (2013.01); *H01G 4/1227* (2013.01); *H01G 4/224* (2013.01); *H01G 4/248* (2013.01); *H05K 1/11* (2013.01); *H05K 1/181* (2013.01); *H01G 4/012* (2013.01); *H05K 2201/10015* (2013.01)

(58) Field of Classification Search
CPC .. H01G 4/00; H01G 4/01; H01G 4/06; H01G 4/08; H01G 4/12; H01G 4/30; H01G 4/224; H05K 1/03; H05K 1/16; H05K 1/18
USPC ................... 174/260, 258; 361/301.4, 321.2
See application file for complete search history.

(56) References Cited

U.S. PATENT DOCUMENTS

| | | |
|---|---|---|
| 2012/0300361 A1 | 11/2012 | Togashi |
| 2014/0168849 A1* | 6/2014 | Lee .......................... H01G 4/30 361/301.4 |

(Continued)

FOREIGN PATENT DOCUMENTS

| | | |
|---|---|---|
| JP | 06-215978 A | 8/1994 |
| JP | 08-55752 A | 2/1996 |

(Continued)

*Primary Examiner* — Xiaoliang Chen
(74) *Attorney, Agent, or Firm* — Morgan Lewis & Bockius LLP

(57) ABSTRACT

A multilayer ceramic capacitor includes a ceramic body in which a plurality of dielectric layers are layered in a width direction, an active part including a plurality of first and second internal electrodes alternately exposed to opposing end surfaces of the ceramic body with the dielectric layer interposed therebetween to form capacitance, an upper cover part provided on an upper surface of the active part, a lower cover part provided on a lower surface of the active part and having a thickness greater than that of the upper cover part, and first and second external electrodes formed to cover opposing end surfaces of the ceramic body, wherein a ratio of the cube root of the volume of the active part to the thickness of the lower cover part is between 1.4 and 8.8.

12 Claims, 6 Drawing Sheets

(56) References Cited

U.S. PATENT DOCUMENTS

| | | | | |
|---|---|---|---|---|
| 2014/0182910 A1* | 7/2014 | Ahn | ................ | H01G 2/06 |
| | | | | 174/260 |
| 2014/0284089 A1 | 9/2014 | Hattori et al. | | |
| 2014/0318845 A1* | 10/2014 | Kim | ................ | H01G 4/01 |
| | | | | 174/260 |
| 2014/0326493 A1* | 11/2014 | Lee | ................ | H01G 4/01 |
| | | | | 174/260 |
| 2015/0255213 A1* | 9/2015 | Lee | ................ | H01G 4/008 |
| | | | | 174/258 |

FOREIGN PATENT DOCUMENTS

| | | | |
|---|---|---|---|
| JP | 2012-248581 A | 12/2012 | |
| JP | 2014-207422 A | 10/2014 | |
| KR | 10-2014-0088366 A | 7/2014 | |

* cited by examiner

MULTILAYER CERAMIC CAPACITOR AND BOARD HAVING THE SAME

CROSS-REFERENCE TO RELATED APPLICATION

This application claims the benefit of priority to Korean Patent Application No. 10-2017-0173579 filed on Dec. 15, 2017 in the Korean Intellectual Property Office, the disclosure of which is incorporated herein by reference in its entirety.

TECHNICAL FIELD

The present disclosure relates to a multilayer ceramic capacitor and a board having the same.

BACKGROUND

A multilayer ceramic capacitor (MLCC), a multilayer chip electronic component, is a chip type condenser mounted on a printed circuit board (PCB) of various electronic products such as a display device including a liquid crystal display (LCD) and a plasma display panel (PDP), a computer, a personal digital assistant (PDA), and cellular phones, to charge or discharge electricity.

Such an MLCC, having advantages such as compactness, guaranteed high capacitance, and ease in the mounting thereof may be used as a component of various electronic devices.

The MLCC may include a plurality of dielectric layers and internal electrodes, having a structure in which the internal electrodes having different polarities are alternately disposed between the dielectric layers.

The dielectric layers may have piezoelectric and electrostrictive properties. Thus, when a direct current (DC) or alternating current (AC) voltage is applied to an MLCC, a piezoelectric phenomenon may occur between the internal electrodes to cause vibrations.

Such vibrations may be transferred to a PCB on which the MLCC is mounted, through an external electrode of the MLCC, leading to the entirety of the PCB acting as an acoustically reflective surface to generate vibratory sound as noise.

Vibratory sound may correspond to audio frequencies ranging from 20 Hz to 20,000 Hz, causing listener discomfort. Such vibratory sound, which may cause listener discomfort, is commonly known as acoustic noise and research is required to reduce acoustic noise.

Japanese Patent Laid-Open Publication No. 1994-215978 discloses an MLCC in which a lower cover layer is thicker than an upper cover layer and discloses a structure in which internal electrodes are formed to be horizontal to a substrate.

SUMMARY

An aspect of the present disclosure may provide a new scheme for reducing noise generated due to vibrations resulting from a piezoelectric phenomenon.

According to an aspect of the present disclosure, a multilayer ceramic capacitor may include: a ceramic body in which a plurality of dielectric layers are layered in a width direction; an active part including a plurality of first and second internal electrodes alternately exposed to opposing end surfaces of the ceramic body with the dielectric layer interposed therebetween to form capacitance; an upper cover part provided on an upper surface of the active part; a lower cover part provided on a lower surface of the active part and having a thickness greater than that of the upper cover part; and first and second external electrodes formed to cover opposing end surfaces of the ceramic body, wherein a ratio of the cube root of the volume of the active part to the thickness of the lower cover part satisfies 1.4 to 8.8.

The plurality of first and second internal electrodes may be stacked to be perpendicular to amounting surface of the ceramic body when the MLCC is mounted on a printed circuit board (PCB).

According to another aspect of the present disclosure, a board having a multilayer ceramic capacitor may include: a printed circuit board (PCB) having first and second electrode pads provided thereon; and a multilayer ceramic capacitor mounted on the PCB, wherein the multilayer ceramic capacitor includes: a ceramic body in which a plurality of dielectric layers are layered in a width direction; an active part including a plurality of first and second internal electrodes alternately exposed to opposing end surfaces of the ceramic body with the dielectric layer interposed therebetween to form capacitance; an upper cover part provided on an upper surface of the active part; a lower cover part provided on a lower surface of the active part and having a thickness greater than that of the upper cover part; and first and second external electrodes formed to cover opposing end surfaces of the ceramic body, wherein a ratio of the cube root of the volume of the active part to the thickness of the lower cover part satisfies 1.4 to 8.8.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
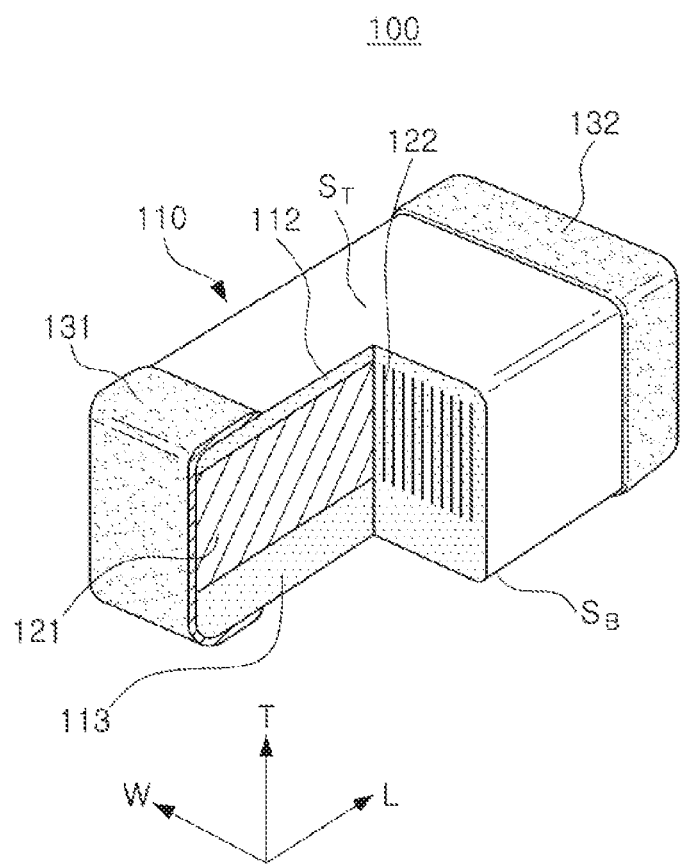
FIG. 1 is a partially cutaway perspective view schematically illustrating a multilayer ceramic capacitor (MLCC) according to an exemplary embodiment in the present disclosure.

Exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Multilayer Ceramic Capacitor

Figure 2:
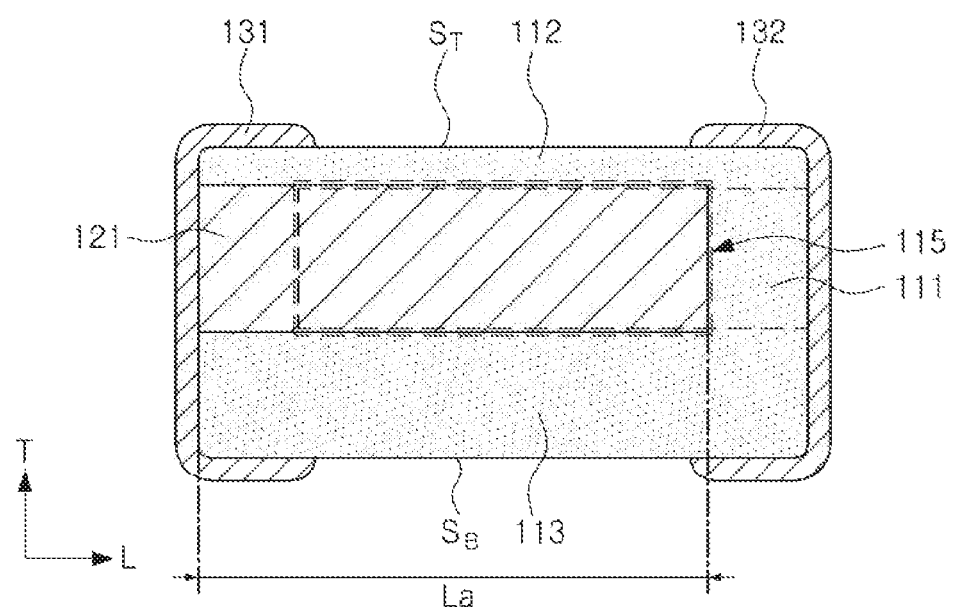
FIG. 2 is a cross-sectional view of the MLCC of FIG. 1, taken along in a length direction.
Figure 3:
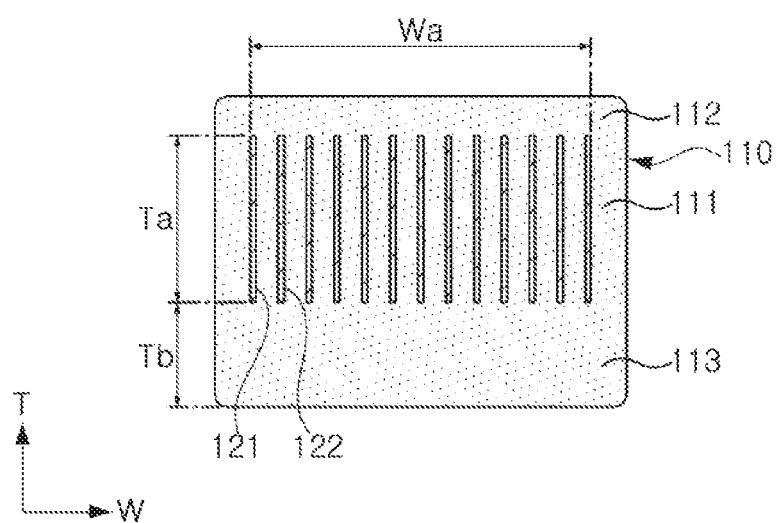
FIG. 3 is a cross-sectional view of the MLCC of FIG. 1, taken along in a width direction.

FIG. 1 is a partially cutaway perspective view schematically illustrating a multilayer ceramic capacitor (MLCC) according to an exemplary embodiment in the present disclosure. FIG. 2 is a cross-sectional view of the MLCC of FIG. 1, taken along in a length direction. FIG. 3 is a cross-sectional view of the MLCC of FIG. 1, taken along in a width direction.

Referring to FIGS. 1 through 3, the MLCC 100 according to an exemplary embodiment in the present disclosure includes a ceramic body 110, an active part 115 including first and second internal electrodes 121 and 122, and upper and lower cover parts 112 and 113, and first and second external electrodes 131 and 132 covering opposing end surfaces of the ceramic body 110.

The ceramic body 110 is formed by stacking a plurality of dielectric layers 111 in the width direction W and subsequently sintering the same. A shape and dimensions of the ceramic body 110 and the amount of stacked dielectric layers 111 are not limited to the present exemplary embodiment.

The plurality of dielectric layers 111 constituting the ceramic body 110 are in a sintered state, and adjacent dielectric layers 111 may be integrated such that boundaries therebetween may not be readily apparent without using a scanning electron microscope (SEM).

The ceramic body 110 may include an active part 115 serving as a part contributing to formation of capacitance of the capacitor and upper and lower cover parts 112 and 113 formed respectively on upper and lower surfaces of the active part 115. The active part 115 may be formed by repeatedly arranging a plurality of first and second internal electrodes 121 and 122 in positions to overlap with the dielectric layer 111 interposed therebetween in the width direction W.

Here, a width of the dielectric layer 111 may be suitably changed in accordance with a capacity design of the MLCC 100. A width of one layer may be configured to be 0.01 to 1.00 μm after sintering, but the present disclosure is not limited thereto.

The dielectric layer 111 may include a ceramic powder having a high dielectric constant, for example, a barium titanate ($BaTiO_3$)-based or a strontium titanate ($SrTiO_3$)-based powder, but the present disclosure is not limited thereto.

The first and second internal electrodes 121 and 122 are a pair of electrodes having different polarities. The first and second internal electrodes 121 and 122 may be formed by printing a conductive paste including a conductive metal to have a predetermined thickness on the plurality of dielectric layers stacked in the width direction such that the first and second internal electrodes 121 and 122 are exposed to opposing end surfaces of the ceramic body 110 in a stacking direction of the dielectric layer 111. The first and second internal electrodes 121 and 122 may be electrically insulated from each other by the dielectric layer 111 interposed therebetween.

That is, the first and second internal electrodes 121 and 122 may be electrically connected to the first and second external electrodes 131 and 132 through the portions alternately exposed through the opposing end surfaces of the ceramic body 110.

When a voltage is applied to the first and second external electrodes 131 and 132, charges are accumulated between the first and second internal electrodes 121 and 122 facing each other, and here, capacitance of, the multilayer ceramic capacitor 100 is proportional to an area of a region in which the first and second internal electrodes 121 and 122 overlap each other.

A width of the first and second internal electrodes 121 and 122 may be determined according to purposes. For example, the width of the first and second internal electrodes 121 and 122 may be determined to fall within a range of 0.2 to 1.0 μm in consideration of a size of the ceramic body 110, but the present disclosure is not limited thereto.

The conductive metal included in the conductive paste forming the first and second internal electrodes 121 and 122 may be nickel (Ni), copper (Cu), palladium (Pd), or alloys thereof, but the present disclosure is not limited thereto.

The conductive paste may be printed by a screen printing method or a gravure printing method, but the present disclosure is not limited thereto.

The first and second internal electrodes 121 and 122 may be stacked to be perpendicular to amounting surface of the ceramic body 110 when the MLCC 100 is mounted on a printed circuit board (PCB).

Details thereof will be described hereinafter.

The lower cover part 113 may be configured to have a thickness greater than that of the upper cover part 112. That is, the thickness of the upper and lower cover parts 112 and 113 may be adjusted by adjusting sizes and positions of the first or second internal electrodes 121 and 122 formed on the dielectric layer 111.

The upper and lower cover parts 112 and 113 may basically serve to prevent damage to the first and second internal electrodes 121 and 122 due to physical or chemical stress.

Dielectric layers used to form the upper and lower cover parts 112 and 113 may be formed of the same material as that of the dielectric layer 111 used to form the active layer 115.

The first and second external electrodes 131 and 132 may be formed of a conductive paste containing a conductive metal. The conductive paste included in the conductive paste may be nickel (Ni), copper (Cu), palladium (Pd), gold (Au), or alloys thereof but the present disclosure is not limited thereto.

Hereinafter, a relationship between the dimensions of the components included in the MLCC according to the present exemplary embodiment and acoustic noise will be described.

Referring to FIGS. 2 and 3, the ratio of the cube root $$\sqrt[3]{Va}$$

of a volume Va of the active part 115 to a thickness Tb of the lower cover part 113 satisfies 1.4 to 8.8.

A volume Va of the active part 115 may be calculated as a product of a length La of the first and second internal electrodes 121 and 122, a dimension Ta of the internal electrodes 121 and 122 measured in the thickness direction of the ceramic body 110, and a distance Wa between the outermost internal electrodes 121 and 122 of the ceramic body 110 in the width direction.

In the calculation of the volume Va of the active part 115, the length of the active part is supposed to be a length of the region in which the first internal electrode 121 and the second internal electrode 122, i.e., a portion forming capacitance, overlap. However, since the length of the overlap region when a plurality of internal electrodes are stacked is not actually uniform, the length of the active part 115 is defined as the length La of the first and second internal electrodes 121 and 122 in an exemplary embodiment in the present disclosure.

The dimension Ta of the internal electrodes 121 and 122 measured in the thickness direction of the ceramic body 110 may be a width of the first and second internal electrodes 121 and 122.

As illustrated in FIG. 3, according to an exemplary embodiment in the present disclosure, since the first and second internal electrodes 121 are stacked to be perpendicular to the mounting surface of the ceramic body 110 when the MLCC 100 is mounted on the PCB, the dimension Ta of each of the internal electrodes 121 and 122 measured in the thickness direction of the ceramic body 110 may also be considered to be a width of the first internal electrode 121 and the second internal electrode 121 and 122.

The dimension Ta of each of the internal electrodes 121 and 122 measured in the thickness direction of the ceramic body 110 may correspond to a thickness of the active part 115.

Also, as illustrated in FIG. 3, the distance Wa between the outermost internal electrodes 121 and 122 in the width direction of the ceramic body 110 may be defined as a distance between the outermost internal electrodes 121 and 122 disposed on one side of the ceramic body 110 in the width direction and the other side of the ceramic body 110 in the width direction.

The distance Wa between the outermost internal electrodes 121 and 122 of the ceramic body 110 in the width direction may correspond to the width of the active part 115.

When voltages having different polarities are applied to the first and second external electrodes 131 and 132 formed on the opposing end surfaces of the ceramic body 110, the ceramic body 110 expands and contracts in the thickness direction due to an inverse piezoelectric effect of the dielectric layers 111 while the opposing ends of the first and second external electrodes 131 and 132 contract and expand, opposite to the expansion and contraction of the ceramic body 110 in the thickness direction due to the Poisson effect.

Here, a central portion of the active part 115 is a portion which expands most extensively at both end portions of the first and second external electrodes 131 and 132 in the length direction, which is a major factor that causes generation of acoustic noise.

That is, in the present exemplary embodiment, in order to reduce acoustic noise, a point of inflection (PI) formed on opposing end surfaces of the ceramic body 110 may be formed below a central portion $CL_C$ of the thickness of the ceramic body 110 due to a difference between strain generated at a center portion $CL_A$ of the active part 115 and strain generated at the lower cover part 113.

In general, acoustic noise generated when a voltage is applied to the MLCC vibrates the board due to a piezoelectric displacement of a piezoelectric material corresponding to the ceramic body and is generated due to an echo of the board.

The piezoelectric displacement tends to increase in proportion to the volume of the active part which realizes capacitance.

The volume of the active part refers to a region excluding a marginal part without an internal electrode in the entire volume of the MLCC.

An influence of piezoelectric vibration may be more accurately determined when the entire volume of the active part which realizes capacitance is taken into consideration, rather than merely a length in the stacking direction.

That is, a force applied to the board due to piezoelectric displacement is proportional to the volume of the active part.

According to an exemplary embodiment in the present disclosure, an optimal critical point that may reduce occurrence of acoustic noise can be obtained by adjusting a ratio of the volume of the active part 115 and the thickness Tb of the lower cover part 113.

That is, according to an exemplary embodiment in the present disclosure, acoustic noise may be reduced when the ratio of the cube root $$\sqrt[3]{Va}$$

of the volume Va of the active part 115 to the thickness Tb of the lower cover part 113 is between 1.4 and 8.8.

It was confirmed that the acoustic noise value sharply decreases from the point where the ratio of the cube root $$\sqrt[3]{Va}$$

of the volume Va of the active part 115 to the thickness Tb of the lower cover part 113 is 8.8 and tends to decrease from therebelow.

In particular, acoustic noise, compared with an existing MLCC, was decreased by 10% or more from a point where the ratio of the cube root $$\sqrt[3]{Va}$$

of the volume Va of the active part 115 to the thickness Tb of the lower cover part 113 is 6.4 or less.

However, when the ratio of the cube root $$\sqrt[3]{Va}$$

of the volume Va of the active part 115 to the thickness Tb of the lower cover part 113 is less than 1.4, the acoustic noise value is not further reduced to less than 36, confirming that the minimum critical point was 1.4.

According to an exemplary embodiment in the present disclosure, a size of the MLCC, in which the ratio of the cube root $$\sqrt[3]{Va}$$

of the volume Va of the active portion 115 to the thickness Tb of the lower cover portion 113 is between 1.4 and 8.8, may be greater than or equal to about 2.0 mm×1.2 mm (2012 size) in length×width (L×W).

In general, the influence of the piezoelectric displacement in the stacking direction of the internal electrodes and the piezoelectric displacement in a direction perpendicular to the stacking direction on acoustic noise varies depending on the size of the MLCC.

When the size of the MLCC is equal to or greater than about 2.0 mm×1.2 mm (2012 size) in length×width (L×W), the piezoelectric displacement in the stacking direction of the internal electrodes was confirmed as a major factor affecting acoustic noise.

Therefore, it can be seen that excellent acoustic noise reduction effect is obtained when the size of the MLCC in which the ratio of the cube root $$\sqrt[3]{Va}$$

of the volume Va of the active part 115 to the thickness Tb of the lower cover part 113 is between 1.4 and 8.8, is about 2.0 mm×1.2 mm (2012 size) or greater in length×width (L×W).

Due to the aforementioned characteristics, acoustic noise may be more effectively reduced in case where the first and second internal electrodes 121 and 122 are stacked to be perpendicular to the mounting surface of the ceramic body 110 when the MLCC 100 is mounted on the PCB.

Generally, when a voltage is applied to a MLCC, the ceramic body repeatedly expands and contracts in the length, width, and thickness directions due to the inverse piezoelectric effect of the dielectric layer.

That is, when displacement in the length-width surface (LW surface) of the ceramic body, displacement in the width-thickness surface (WT surface) of the ceramic body, and displacement in the length-thickness surface (LT surface) of the ceramic body are measured by a laser Doppler vibrometer (LDV), the measurements of the displacements appear in order of LW surface>WT surface>LT surface.

The displacement in the LT surface compared with the WT surface is about 42%, which is smaller than that of the WT surface. The reason is because, stresses having the same magnitude are generated in the LT surface and the WT surface; however, since the LT surface is larger than the WT surface, it is presumed that stresses having a similar magnitude are distributed over the large area to generate relatively small deformation.

Thus, it can be seen that displacement in the LT surface is smallest in a general MLCC.

That is, the first and second internal electrodes 121 and 122 may be stacked to be perpendicular to the mounting surface of the ceramic body 110 when the MLCC is mounted on the PCB, to minimize vibration.

Experimental Example

MLCCs according to Embodiment Examples and Comparative Examples were manufactured as follows.

First, a slurry formed to include a powder such as barium titanate ($BaTiO_3$) was applied to carrier film and dried to prepare a plurality of ceramic green sheets having a thickness of 1.8 μm.

Next, a conductive paste was applied to the plurality of ceramic green sheets using a screen to form a plurality of first and second internal electrodes 121 and 122 such that the first and second internal electrodes 121 and 122 are alternately exposed to opposing end surfaces of the ceramic green sheets.

Here, the lower cover part 113 provided in the thickness direction T of the ceramic green sheet with respect to the first or second internal electrodes 121 and 122 is formed to be thicker than the upper cover part 112.

Next, about 370 layers of the ceramic green sheets were stacked in the width direction (W) to form a multilayer body, and the multilayer body was subjected to isostatic pressing under pressure of 1000 kgf/cm² at 85° C.

Thereafter, the compressed ceramic multilayer body was cut into individual chips. The cut chips were maintained at 230° C. for 60 about hours in an atmospheric air to proceed with debinding.

Thereafter, the ceramic body was sintered in a reducing atmosphere under an oxygen partial pressure of $10^{-11}$ to $10^{-10}$ atm lower than a Ni/NiO equilibrium oxygen partial pressure so that the first and second internal electrodes 121 and 122 were not oxidized at 1,200° C. After the sintering, a size of the ceramic body 110 was about 2.0 mm×1.2 mm (L×W, a so-called 2012 size) in length×width (L×W). Here, manufacturing tolerance was set to a range of ±0.1 mm in length×width (L×W).

Next, first and second external electrodes 131 and 132 were formed on opposing end surfaces of the ceramic body 110 such that the lower cover part 113 is a lower surface $S_B$ of the ceramic body 110, and underwent plating to manufacture the MLCC 100. Thereafter, acoustic noise was measured through experiment.

TABLE 1

| | La (mm) | Wa (mm) | Ta (mm) | Va (mm³) | $\sqrt[3]{Va}$ (mm) | Tb (mm) | $\sqrt[3]{Va}/T_b$ | A/N (dB) |
|---|---|---|---|---|---|---|---|---|
| 1* | 1.97 | 1.11 | 1.26 | 2.76 | 1.402 | 0.07 | 20.0 | 45.4 |
| 2 | 1.97 | 1.12 | 1.25 | 2.76 | 1.402 | 0.16 | 8.8 | 11.2 |
| 3 | 1.98 | 1.12 | 1.26 | 2.79 | 1.408 | 0.18 | 7.8 | 42.5 |
| 4 | 1.96 | 1.13 | 1.25 | 2.77 | 1.404 | 0.22 | 6.4 | 41.3 |
| 5 | 1.97 | 1.12 | 1.25 | 2.76 | 1.402 | 0.7 | 2.0 | 39.3 |
| 6 | 1.96 | 1.12 | 1.26 | 2.77 | 1.404 | 1 | 1.4 | 36.3 |
| 7* | 1.97 | 1.12 | 1.25 | 2.76 | 1.402 | 1.8 | 0.8 | 36.6 |
| 8* | 3.25 | 1.62 | 1.52 | 8.00 | 2.000 | 0.12 | 16.7 | 47.3 |
| 9* | 3.24 | 1.63 | 1.51 | 7.97 | 1.998 | 0.18 | 11.1 | 46.8 |
| 10 | 3.23 | 1.64 | 1.50 | 7.95 | 1.995 | 0.25 | 8.0 | 43.4 |
| 11 | 3.25 | 1.63 | 1.52 | 8.05 | 2.004 | 0.63 | 3.2 | 40.3 |
| 12 | 3.24 | 1.63 | 1.51 | 7.97 | 1.998 | 0.92 | 2.2 | 39.1 |
| 13 | 3.25 | 1.64 | 1.49 | 7.94 | 1.995 | 1.32 | 1.5 | 37.2 |
| 14* | 3.24 | 1.63 | 1.51 | 7.97 | 1.998 | 1.58 | 1.3 | 37.7 |
| 15* | 3.23 | 1.65 | 1.52 | 8.10 | 2.008 | 2.3 | 0.9 | 36.8 |

*is comparative example

The data in Table 1 indicates that acoustic noise can be reduced as the ratio of the cube root $$\sqrt[3]{Va}$$

of the volume Va of the active part 115 to the thickness Tb of the lower cover part 113 is between 1.4 and 8.8.

It was confirmed that the acoustic noise value sharply decreases from a point where the ratio of the cube root $$\sqrt[3]{Va}$$

of the volume Va of the active part 115 to the thickness Tb of the lower cover part 113 is 8.8 and tends to decrease from therebelow.

That is, samples 2 to 6 and 10 to 13, in which the ratio of the cube root $$\sqrt[3]{Va}$$

of the volume Va of the active part 115 to the thickness Tb of the lower cover part 113 is between 1.4 and 8.8, have the acoustic noise reducing effect.

In particular, it can be seen that, when the ratio of the cube root $$\sqrt[3]{Va}$$

of the volume Va of the active part 115 to the thickness Tb of the lower cover part 113 is 6.4 or less, acoustic noise compared with the existing MLCC is reduced by 10% or greater.

However, it can be seen that, in samples 7, 14, and 15 in which the ratio of the cube root $$\sqrt[3]{Va}$$

of the volume Va of the active part 115 to the thickness Tb of the lower cover part 113 is less than 1.4, the acoustic noise value was not reduced to below 36 so the lowest critical point is 1.4.

In samples 1, 8 and 9 in which the ratio of the cube root $$\sqrt[3]{Va}$$

of the volume Va of the active part 115 to the thickness Tb of the lower cover part 113 exceeds 8.8, the acoustic noise value is high.

Board Having MLCC

Figure 4:
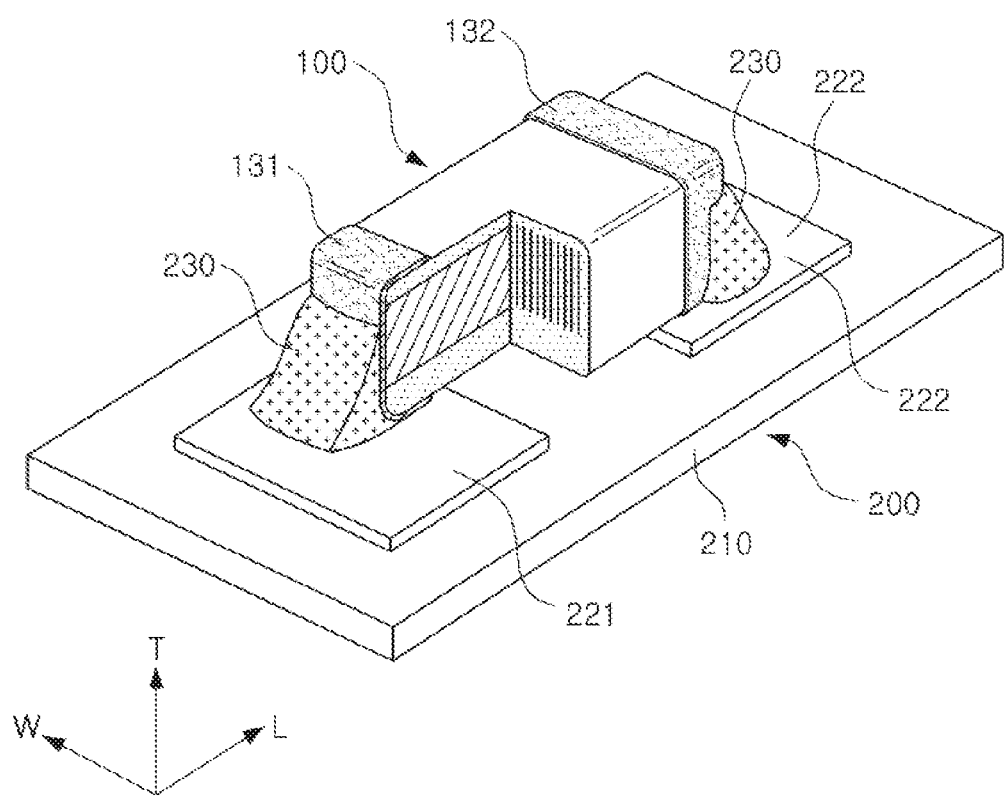
FIG. 4 is a perspective view illustrating a state in which the MLCC of FIG. 1 is mounted on a printed circuit board (PCB)
Figure 5:
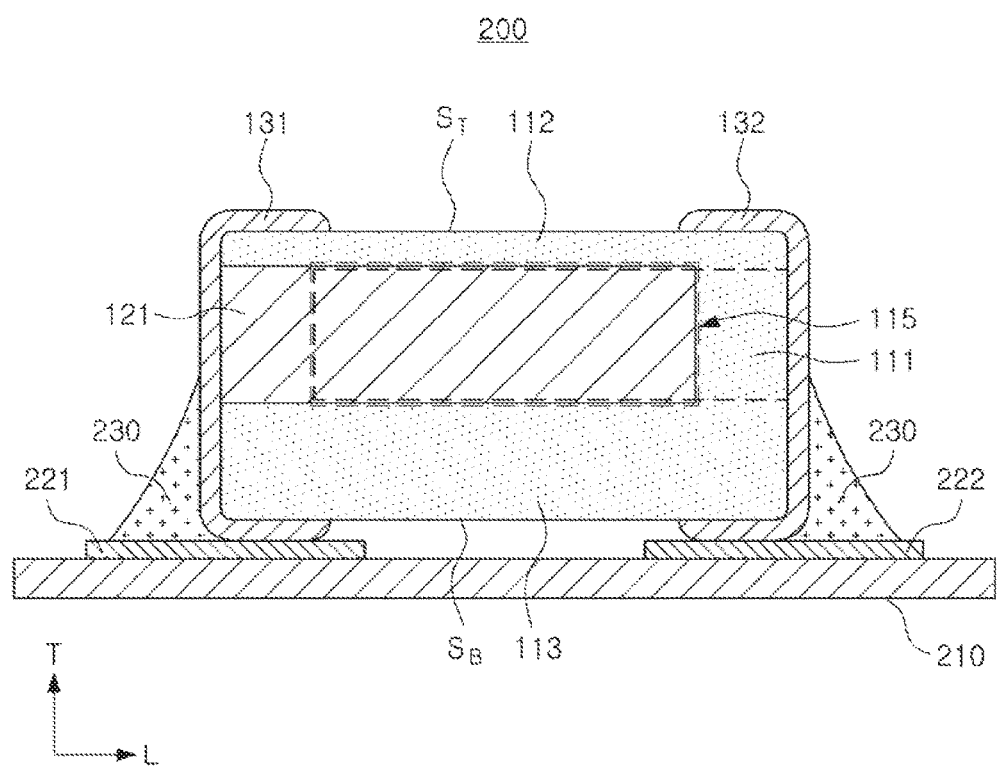
FIG. 5 is a cross-sectional view of the MLCC and the PCB of FIG. 4, taken in the length direction.

FIG. 4 is a perspective view illustrating a state in which the MLCC of FIG. 1 is mounted on a printed circuit board (PCB). FIG. 5 is a cross-sectional view of the MLCC and the PCB of FIG. 4, taken in the length direction.

Referring to FIGS. 4 and 5, a board 200 of the MLCC 100 according to the present exemplary embodiment includes a printed circuit board 210 on which the MLCC 100 is vertically mounted and first and second electrode pads 221 and 222 formed on an upper surface of the board 210 and spaced apart from each other.

Here, in a state in which the lower cover part 113 is disposed on a lower side and the first and second external electrodes 131 and 132 are positioned on the first and second electrode pads 221 and 222 in a contacting manner, the MLCC 100 may be electrically connected to the PCB 210 by solder 230.

Acoustic noise may be generated when a voltage is applied in a state in which the MLCC 100 is mounted on the PCB 210 as described above.

The size of the first and second electrode pads 221 and 222 may be an indicator determining an amount of soldering 230 connecting the first and second external electrodes 131 and 132 of the MLCC 100 and the first and second electrode pads 221 and 222. In addition, a magnitude of the acoustic noise may be adjusted according to the amount of the soldering 230.

Figure 6:
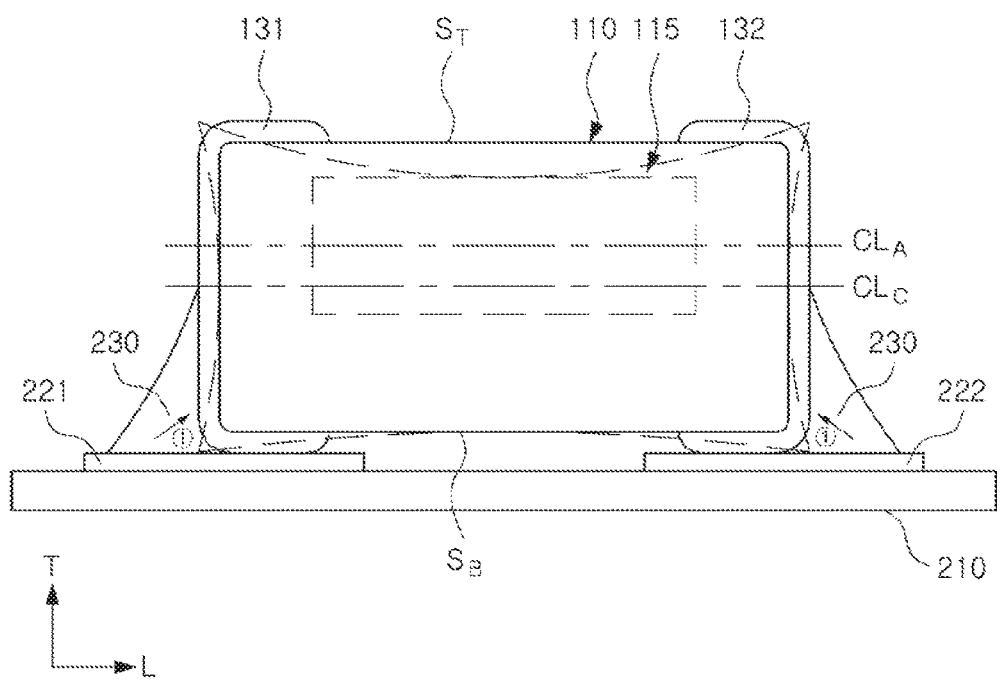
FIG. 6 is a cross-sectional view schematically illustrating a state in which the MLCC of FIG. 4 mounted on a PCB is deformed as a voltage is applied.

FIG. 6 is a cross-sectional view schematically illustrating a state in which the MLCC of FIG. 4 mounted on a PCB is deformed as a voltage is applied.

Referring to FIG. 6, in a state in which the MLCC 100 is mounted on the PCB 210, when voltages having different polarities are applied to the first and second external electrodes 131 and 132 formed on opposing end surfaces of the MLCC 100, the ceramic body 110 expands and contracts in the thickness direction due to inverse piezoelectric effect of the dielectric layer 111 and opposing end portions of the first and second external electrodes 131 and 132 contract and expand, opposite to the expansion and contraction of the ceramic body 110 in the thickness direction due to the Poisson effect.

Here, a central portion of the active part 115 is maximally expanded portion in the opposing end portions of the first and second external electrodes 131 and 132 in the length direction, which is a factor that mainly causes generation of acoustic noise.

When a lower surface $S_B$ of the MLCC 100 expands upwards to a maximum extent in the thickness direction, a contracted force ① applied to the external electrodes is generated by a force pushed to the outside by the expansion is generated, and the upper surface $S_T$ and the side surfaces of the ceramic body 110 are also contracted.

Therefore, as in the present exemplary embodiment, when a point of inflection formed on opposing end surfaces of the ceramic body 110 is formed at a level lower than the height of the soldering 230 due to a difference between strain generated at the central portion $CL_A$ of the active part 115 and strain generated at the lower cover part 113 according to application of a voltage, acoustic noise may further be reduced.

As set forth above, according to exemplary embodiments of the present disclosure, and acoustic noise generated in the PCB may be reduced by reducing vibration generated in the MLCC.

Also, an optimal ratio of the volume of the active part and the thickness of the lower cover part, capable of reducing acoustic noise generated in the PCB by reducing vibration generated in the MLCC, may be provided.

While exemplary embodiments have been shown and described above, it will be apparent to those skilled in the art that modifications and variations could be made without departing from the scope of the present disclosure as defined by the appended claims.

What is claimed is:

1. A multilayer ceramic capacitor (MLCC) comprising:
   a ceramic body in which a plurality of dielectric layers are layered in a width direction;
   an active part including a plurality of first and second internal electrodes alternately exposed to opposing end surfaces of the ceramic body with the dielectric layer interposed therebetween to form capacitance;
   an upper cover part provided on an upper surface of the active part;
   a lower cover part provided on a lower surface of the active part and having a thickness greater than that of the upper cover part; and
   first and second external electrodes formed to cover opposing end surfaces of the ceramic body,
   wherein a ratio of cube root of volume of the active part to the thickness of the lower cover part is between 1.4 and 8.8.

2. The multilayer ceramic capacitor of claim 1, wherein the plurality of first and second external electrodes are stacked to be perpendicular to a mounting surface of the ceramic body when the MLCC is mounted on a printed circuit board (PCB).

3. The multilayer ceramic capacitor of claim 1, wherein a size of the multilayer ceramic capacitor is about 2.0 mm×1.2 mm (2012 size) in length×width (L×W).

4. The multilayer ceramic capacitor of claim 1, wherein the volume of the active part is calculated as a product of a length La of the first and second internal electrodes, a dimension Ta of the internal electrode measured in a thickness direction of the ceramic body, and a distance Wa between the outermost internal electrodes of the ceramic body in a width direction.

5. The multilayer ceramic capacitor of claim 4, wherein the dimension Ta of the internal electrode of the ceramic body measured in the thickness direction is a width of the first and second internal electrodes.

6. The multilayer ceramic capacitor of claim 4, wherein the distance Wa between the outermost internal electrodes of the ceramic body in the width direction is a distance between the outermost internal electrodes disposed on one side of the ceramic body and the other side of the ceramic body in the width direction.

7. A board having a multilayer ceramic capacitor, the board comprising:
   a printed circuit board (PCB) having first and second electrode pads provided thereon; and
   a multilayer ceramic capacitor (MLCC) mounted on the PCB,
   wherein the multilayer ceramic capacitor includes:
   a ceramic body in which a plurality of dielectric layers are layered in a width direction;
   an active part including a plurality of first and second internal electrodes alternately exposed to opposing end surfaces of the ceramic body with the dielectric layer interposed therebetween to form capacitance;
   an upper cover part provided on an upper surface of the active part;
   a lower cover part provided on a lower surface of the active part and having a thickness greater than that of the upper cover part; and
   first and second external electrodes formed to cover opposing end surfaces of the ceramic body and connected to the first and second electrode pads by solder,
   wherein a ratio of cube root of volume of the active part to the thickness of the lower cover part is between 1.4 and 8.8.

8. The board of claim 7, wherein the plurality of first and second external electrodes are stacked to be perpendicular to a mounting surface of the ceramic body when the MLCC is mounted on a printed circuit board (PCB).

9. The board of claim 7, wherein a size of the multilayer ceramic capacitor is about 2.0 mm×1.2 mm (2012 size) in length×width (L×W).

10. The board of claim 7, wherein a volume of the active part is calculated as a product of a length La of the first and second internal electrodes, a dimension Ta of the internal electrode measured in a thickness direction of the ceramic body, and a distance Wa between the outermost internal electrodes of the ceramic body in a width direction.

11. The board of claim 10, wherein the dimension Ta of the internal electrode of the ceramic body measured in the thickness direction is a width of the first and second internal electrodes.

12. The board of claim 10, wherein the distance Wa between the outermost internal electrodes of the ceramic body in the width direction is a distance between the outermost internal electrodes disposed on one side of the ceramic body and the other side of the ceramic body in the width direction.

* * * * *